United States Patent [19]

Remedi

[11] 4,165,504
[45] Aug. 21, 1979

[54] CMOS DECODER

[75] Inventor: James J. Remedi, Austin, Tex.

[73] Assignee: Motorola, Inc., Schaumburg, Ill.

[21] Appl. No.: 895,849

[22] Filed: Apr. 13, 1978

[51] Int. Cl.² ............................................. H04Q 3/00
[52] U.S. Cl. ...................... 340/167 R; 340/311
[58] Field of Search ........................... 340/167 R, 311

[56] References Cited

U.S. PATENT DOCUMENTS 4,110,743  8/1978  Zahnd .............................. 340/167 R Primary Examiner—Harold I. Pitts
Attorney, Agent, or Firm—Joe E. Barbee

[57] ABSTRACT

A CMOS digital decoder has a plurality of circuits having first and second output nodes. A first transistor is used to precharge the first output node and a second transistor is used to precharge the second output node. A third transistor responsive to an enable signal is used to enable the decoder. A fourth transistor is coupled between the third transistor and the first output node and a fifth transistor is coupled between the third transistor and the second output node. A plurality of transistors can be in series between the fourth transistor and the third transistor, or the plurality of transistors can be in parallel between the first and second output nodes depending upon the type of decoder output desired. The decoder can be made a static decoder by coupling a pair of back-to-back inverters to each of the output nodes.

10 Claims, 2 Drawing Figures

CMOS DECODER

BACKGROUND OF THE INVENTION

This invention relates, in general, to digital decoders, and more particularly, to complementary metal oxide semiconductor (CMOS) decoders.

Decoders are widely used in digital systems for decoding digital messages or signals such as addresses, commands or instructions. It is desirable that decoders be small in physical size, be of low power consumption, and yet provide reasonably high speed operation.

Accordingly, it is an object of the present invention to provide a digital decoder that is relatively small in size, low in power consumption and uses CMOS circuitry.

Another object of the present invention is to provide a CMOS decoder small in size and capable of providing a static output by using a pair of back-to-back inverters coupled to the output.

SUMMARY OF THE INVENTION

In carrying out the above and other objects of the invention in one form, there is provided an improved decoder using CMOS circuitry. The decoder has a plurality of circuits having a first and a second output node. A first means is used to controllably precharge the first output node and a second means is used to controllably precharge the second output node. A third means responsive to an enable signal is used to enable the decoder. A first transistor is coupled between the third means and the first output node and a second transistor is coupled between the third means and the second output node. A first pair of back-to-back inverters can be coupled to the first output node and a second pair of back-to-back inverters can be coupled to the second output node. The pairs of back-to-back inverters are used to provide the output nodes with a static output signal. In a first embodiment a plurality of transistors are placed in parallel between the first and second output nodes. Each of the plurality of transistors is enabled by a different one of the bits of the digital signal to be decoded. In another embodiment of the decoder the plurality of transistors are all connected in series between the third means and the first and second transistors.

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiments of the invention in one form thereof, and such exemplifications are not to be considered as limiting in any manner.

DESCRIPTION OF THE PREFERRED EMBODIMENTS

Figure 1:
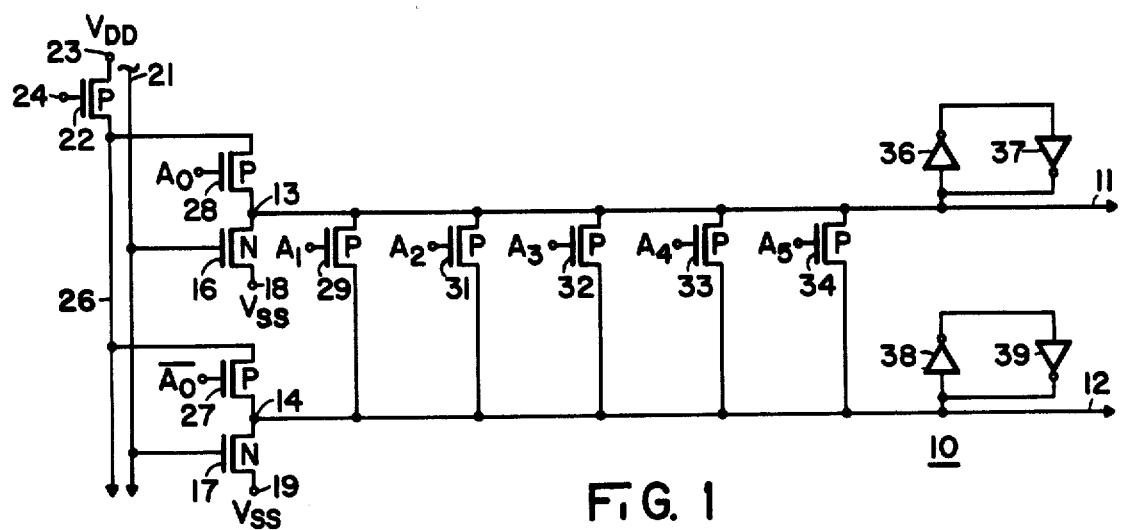
FIG. 1 illustrates an embodiment of the invention in one form thereof.

FIG. 1 illustrates one of a plurality of circuits used in a decoder of the present invention. A decoder using the circuit illustrated in FIG. 1 would contain thirty-two such circuits, since as illustrated the digital signal to be decoded contains six digital bits (A0 through A5). In many decoders of the prior art, sixty-four such circuits would be required to decode a six bit signal. However, the circuit of FIG. 1 takes advantage of the fact that in a binary number only the least significant bit changes for two successive numbers. Therefore, as shown in FIG. 1 the least significant bit A0 and its complement, $\overline{A0}$, is used in each circuit 10 of the decoder. All combinations of A1, A2, A3, A4, and A5 or their complements are repeated for each of the subsequent circuits so that the last circuit used in the decoder will have all complement functions of A1, A2, A3, A4, and A5, or $\overline{A1}, \overline{A2}, \overline{A3}, \overline{A4},$ and $\overline{A5}$.

Output node 13 is connected to line 11 which is an output of the decoder and would connect to a line or column of a memory if the circuit 10 was used in a decoder for decoding a memory address. Line 12 is connected to output node 14 and is a second output for the circuit 10 of the decoder. It should be noted that not all of the circuits used in the decoder are shown since the only difference would be whether the true or complement bit would be connected to one of the gates of parallel transistors 29, 31, 32, 33, or 34. These parallel transistors appear between lines 11 and 12. The number of parallel transistors between nodes 13 and 14 depends upon the number of bits in the digital signal desired to be decoded. The more or less bits in the digital signal desired to be decoded, then, the more or less, respectively, parallel transistors that would be required.

Transistor 16 has a first electrode connected to output node 13 and a second electrode connected to terminal 18. A voltage such as $V_{SS}$ is connected to terminal 18. In most cases $V_{SS}$ would be a reference voltage such as ground or zero volts or $V_{SS}$ is the most negative potential in the circuit. The gate of transistor 16 is connected to line 21. Line 21 typically carries a precharge enable signal and when transistor 16 is enabled by this signal it serves as a means to precharge output node 13. Transistor 17 performs the same function for output node 14 as transistor 16 does for output node 13. The gate electrode of transistor 17 is also connected to precharge enable line 21. Lines 21 and 26 are connected to the other circuits, such as circuit 10, of the total decoder. Transistor 22 has a first electrode connected to terminal 23. Typically, terminal 23 is connected to voltage $V_{DD}$ which normally is the most positive voltage used in the circuit. A second electrode of transistor 22 is connected to line 26. The gate electrode of transistor 22 is connected to line 24 which carries the decoder enable signal. Transistor 22 serves as a means to precharge line 26. When the decoder enable signal is present at line 24, the decoder is enabled so that it can decode the digital signal appearing at transistors 27 through 29 and 31 through 34. As stated hereinbefore, circuit 10 is only one of thirty-two circuits used in a decoder. All the transistors shown in FIG. 1 are P channel MOS transistors except for transistors 16 and 17 which are N channel MOS transistors.

A pair of back-to-back inverters 36 and 37 are connected to line 11. This pair of back-to-back inverters 36 and 37 make node 13 and line 11 static. As an example, when transistor 16 is enabled node 13 becomes charged to the voltage $V_{SS}$ appearing at terminal 18. This voltage is inverted by inverter 36 and connected to the input of inverter 37. Inverter 37 inverts the signal and applies it back to line 11 and to the input of inverter 36. Inverters 36 and 37 cooperate to maintain line 11 at the voltage $V_{SS}$ until transistor 28 is enabled by A0, then node 13 is raised to the voltage $V_{DD}$ provided that transistor 22 was previously enabled. Back-to-back inverters 38 and 39 perform the same functions for line 12 as do inverters 36 and 37 for line 11. Since each one of the outputs of the decoder will have a pair of back-to-back inverters connected to it the dynamic decoder now becomes a static decoder.

In normal operation of the decoder, each output node such as nodes 13 and 14 of circuit 10 will be precharged to a level $V_{SS}$ when the precharge enable signal appears on line 21. If voltage level $V_{SS}$ is considered to be a logic "0" and voltage $V_{DD}$ is considered to be a logic "1", then lines 11 and 12 will now carry a logic "0" level. Once output nodes 13 and 14 are precharged, then transistor 22 is enabled causing voltage $V_{DD}$ to appear on line 26. Since A0 and $\overline{A0}$ represent the least significant bit of a digital signal, either transistor 27 or 28 will be enabled. Assuming A0 is present, transistor 28 will be enabled and node 13 will then be changed from a logic level "0" to a logic level "1". If none of the other transistors 29 or 31 through 34 are enabled then output line 11 will carry a logic "1" while output line 12 will carry a logic "0". Back-to-back inverters 36 and 37 will maintain line 11 at a logic "1" while back-to-back inverters 38 and 39 will maintain line 12 at a logic "0". However, if one or more of transistors 29 or 31 through 34 is also enabled then a logic "1" at node 13 will be coupled to line 12 thereby causing output 12 to also be a logic "1". A decoder having a plurality of circuits such as circuit 10 could be an active low decoder, meaning that a low output or logic "0" is a decoded output. Such a decoder is suitable as an address decoder for a read only memory (ROM) or in any application where a digital signal needs to be decoded.

By way of example only, the following transistor sizes have been found to provide satisfactory operation in circuit 10. The size ratios denote commonly used notations to indicate the width to length ratio of a MOS field effect transistor.

|  | Size (Microns) |
|---|---|
| Transistor 22 | 1150/8 |
| Transistor 28 | 18/8 |
| Transistor 16 | 11/8 |
| Transistor 27 | 18/8 |
| Transistor 17 | 11/8 |
| Transistor 29 | 18/8 |
| Transistor 31 | 18/8 |
| Transistor 32 | 18/8 |
| Transistor 33 | 18/8 |
| Transistor 34 | 18/8 |
| Inverter 36 | 6/8 |
| Inverter 37 | 6/35 |
| Inverter 38 | 6/8 |
| Inverter 39 | 6/35 |

The sizes given for the inverters are for both the P channel and the N channel transistors in the inverters. Note that inverters 37 and 39 are very very weak inverters to allow a change at nodes 13 or 14 to easily override the inverter thereby reflecting a new static state on output lines 11 or 12.

Figure 2:
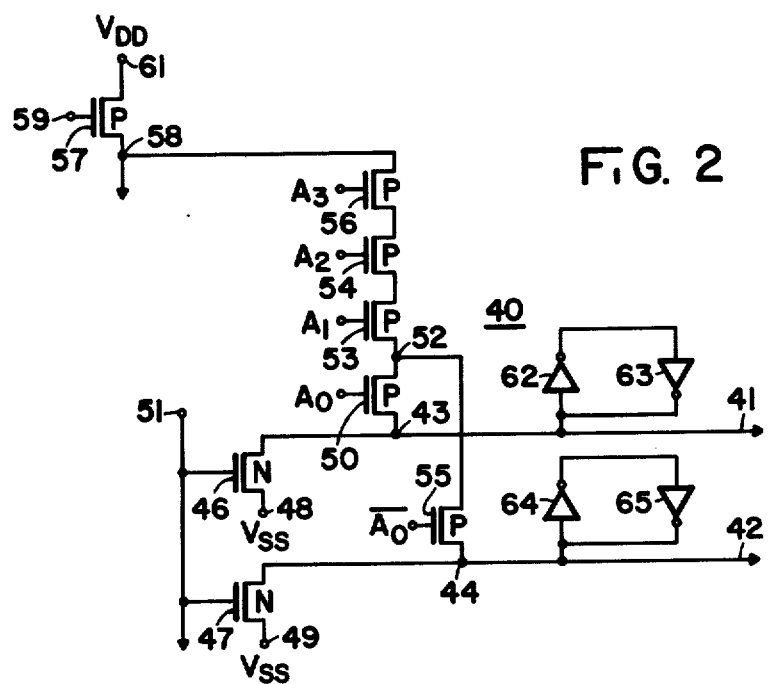
FIG. 2 illustrates another embodiment of the invention.

FIG. 2 illustrates in schematic form a circuit 40 useful in a decoder having an active high output. A decoder having a plurality of circuits 40 would be more suitable as an address decoder for a RAM memory than would a decoder having a plurality of circuits 10. Circuit 40 has an output node 43 connected to output line 41 and output node 44 connected to output line 42. Output node 43 can be precharged by transistor 46, to voltage $V_{SS}$ at terminal 48, when transistor 46 is enabled by a precharge signal on line 51. Output node 44 is precharged by transistor 47, to voltage $V_{SS}$ at node 49, when a precharge signal is supplied to line 51. Transistor 57 serves as a decoder enable means having a first electrode connected to terminal 61, which is a $V_{DD}$ terminal, and a second electrode connected to node 58. Node 58 also goes to other circuits such as circuits 40 used in the decoder. Transistor 57 is enabled by a decoder enable signal appearing on line 59, which is connected to the gate electrode of P channel transistor 57. When transistor 57 is enabled then node 58 is precharged to voltage $V_{DD}$. In order to couple the signal at node 58 to node 52 all of the series P channel transistors 53, 54, and 56 must be enabled. The number of series transistors between nodes 58 and 52 depends upon the number of bits in the digital signal desired to be decoded. The more bits in the signal desired to be decoded then of course the more series transistors that would be required. The signal appearing at node 52 can be coupled to either output node 44 or to output node 43 depending upon which P channel transistor 50 or 55 is enabled. Since either transistor 50 or 55 will be enabled by the least significant bit in the digital signal, one or the other will be enabled each time a digital signal is decoded. However, it should be noted that no change may occur to output lines 41 or 42 if only one of the series P channel transistors is not enabled. Back-to-back inverters 62 and 63 are connected to output line 41 and back-to-back inverters 64 and 65 are connected to output line 42. These inverters perform the same function and operate the same as the inverters shown in FIG. 1. Each pair of inverters in FIG. 2 is the same size as each pair of inverters shown in FIG. 1. Line 51 of course goes to other circuits such as circuit 40 in the decoder so that all of the decoder's output lines are precharged simultaneously.

By way of example only, the following sizes of MOS transistors were found to perform satisfactorily in circuit 40.

|  | |
|---|---|
| Transistor 57 | 480/8 |
| Transistor 46 | 11/8 |
| Transistor 47 | 11/8 |
| Transistor 56 | 30/8 |
| Transistor 54 | 30/8 |
| Transistor 53 | 30/8 |
| Transistor 50 | 30/8 |
| Transistor 55 | 30/8 |

All transistors of FIG. 2 are P channel except for transistors 46 and 47 which are N channel transistors.

It will be recognized that all the P channel transistors can be replaced by N channel transistors and the N channel transistors, illustrated, replaced by P channel transistors then voltages $V_{DD}$ and $V_{SS}$ can be reversed, and still maintain the benefits of the present invention.

Consequently, while in accordance with the Patent Statutes, there has been described what at present is considered to be the preferred form of the invention, it will be obvious to those skilled in art that numerous changes and modifications may be made herein without departing from the spirit and scope of the invention, and it is therefore aimed that the following claims cover all such modifications.

What is claimed as new and desired to secure by Letters Patent of the United States is:

1. A digital data decoder having a plurality of circuits comprising: a first and a second output; first means coupled to the first output to controllably precharge the first output; second means coupled to the second output to controllably precharge the second output; a first transistor having a first and a second current carrying electrode and having a control electrode, the first electrode being coupled to a first supply voltage, the control electrode being coupled to a timing signal to enable the first transistor at a predetermined time; a second and third transistor each having first and second electrodes and each having a control electrode, the first electrode of the second and third transistors being coupled to the second electrode of the first transistor, the second electrode of the second transistor being coupled to the first output, the second electrode of the third transistor being coupled to the second output, the control electrode of the second transistor being coupled to a least significant bit of a coded digital signal, the control electrode of the third transistor being coupled to the complement of the signal coupled to the control electrode of the second transistor; a first and a second pair of back-to-back inverters, the first pair of inverters being coupled to the first output and the second pair of inverters being coupled to the second output, the back-to-back inverters being capable of maintaining the outputs in a static state; and a plurality of transistors coupled between the first and second output, each of the plurality of transistors having a control electrode coupled to a different bit of the coded digital signal.

2. A digital data decoder as recited in claim 1 wherein the transistors are field effect transistors and the first and second means are both N-channel field effect transistors.

3. A digital decoder for decoding a coded digital signal having a plurality of digital bits and a least significant bit, the decoder having a plurality of circuits comprising: a first and a second output node; first means for controllably precharging the first output node to a predetermined voltage; second means for controllably precharging the second output node to the predetermined voltage; third means for controllably applying a second predetermined voltage to a third node; a plurality of transistors connected in series from the third node to a fourth node, each of the plurality of transistors having a control electrode coupled to a different one of the bits of the coded digital signal; a first transistor for selectively coupling the fourth node to the first output node; a second transistor for selectively coupling the fourth node to the second output node; a first pair of back-to-back inverters coupled to the first output node to produce a static state at the first output node; and a second pair of back-to-back inverters coupled to the second output node to produce a static state at the second output node.

4. A digital decoder as recited in claim 3 wherein the first and second means for controllably precharging are enabled by a first timing signal and the third means being enabled by a second timing signal.

5. A digital decoder as recited in claim 3 wherein the plurality of transistors and the first and second transistors are all field effect transistors.

6. A digital decoder as recited in claim 3 wherein the first and second pairs back-to-back inverters each include CMOS transistors.

7. A digital decoder as recited in claim 3 wherein the first transistor is enabled by the least significant bit and the second transistor is enabled by a complement of the least significant bit.

8. A digital signal decoder having a plurality of circuits comprising: a first and a second output node; first means for controllably applying a first voltage level to a third node; a second transistor being coupled between the third node and the first output node, the second transistor being enabled by the least significant bit of a digital signal being decoded; a third transistor coupled between the third node and the second output node, the third transistor being enabled by the complement of the least significant bit; a fourth transistor coupled between the first output node and a second voltage level to controllably precharge the first output node; a fifth transistor coupled between the second output node and the second voltage level to controllably precharge the second output node and a pair of back-to-back inverters coupled to each output node.

9. A digital signal decoder as recited in claim 8 further including a plurality of transistors connected in series between the third node and the second transistor.

10. A digital signal decoder as recited in claim 8 further including a plurality of transistors coupled in parallel between the first and second output node.

* * * * *